United States Patent [19]

Humphrey

[11] 4,306,115

[45] Dec. 15, 1981

[54] AUTOMATIC VOLUME CONTROL SYSTEM

[76] Inventor: Francis S. Humphrey, 108 Main St., Leitersburg, Md. 21740

[21] Appl. No.: 131,567

[22] Filed: Mar. 19, 1980

[51] Int. Cl.³ ............................................... H03G 3/32
[52] U.S. Cl. .................................. 179/1 VL; 179/1 P
[58] Field of Search ................. 179/1 AT, 1 F, 1 FS, 179/1 J, 1 P, 1 VC, 1 VL, 1 VE; 455/219, 220, 222, 232, 249

[56] References Cited

U.S. PATENT DOCUMENTS 3,105,877 10/1963 Miller et al. ..................... 179/1 FS
3,922,488 11/1975 Gabr ................................. 179/1 FS

*Primary Examiner*—Bernard Konick
*Assistant Examiner*—J. A. Popek

*Attorney, Agent, or Firm*—William G. Gapcynski; Werten F. W. Bellamy

[57] ABSTRACT

An automatic volume control system comprises a source for producing an audio signal; an amplifier responsive to a control signal for varying the amplitude of the audio signal, a transducer for converting the audio signal to sound energy, a detector for detecting the output of the transducer and ambient noise which interferes with comprehension of the sound energy, and a phase comparator connected to the detector and to the audio signal source for comparing the phases of the outputs thereof and for producing an output proportional to the level of detected ambient noise. The output of the phase comparator is connected as a control signal to the amplifier means so as to control the amplitude of the audio signal.

4 Claims, 1 Drawing Figure

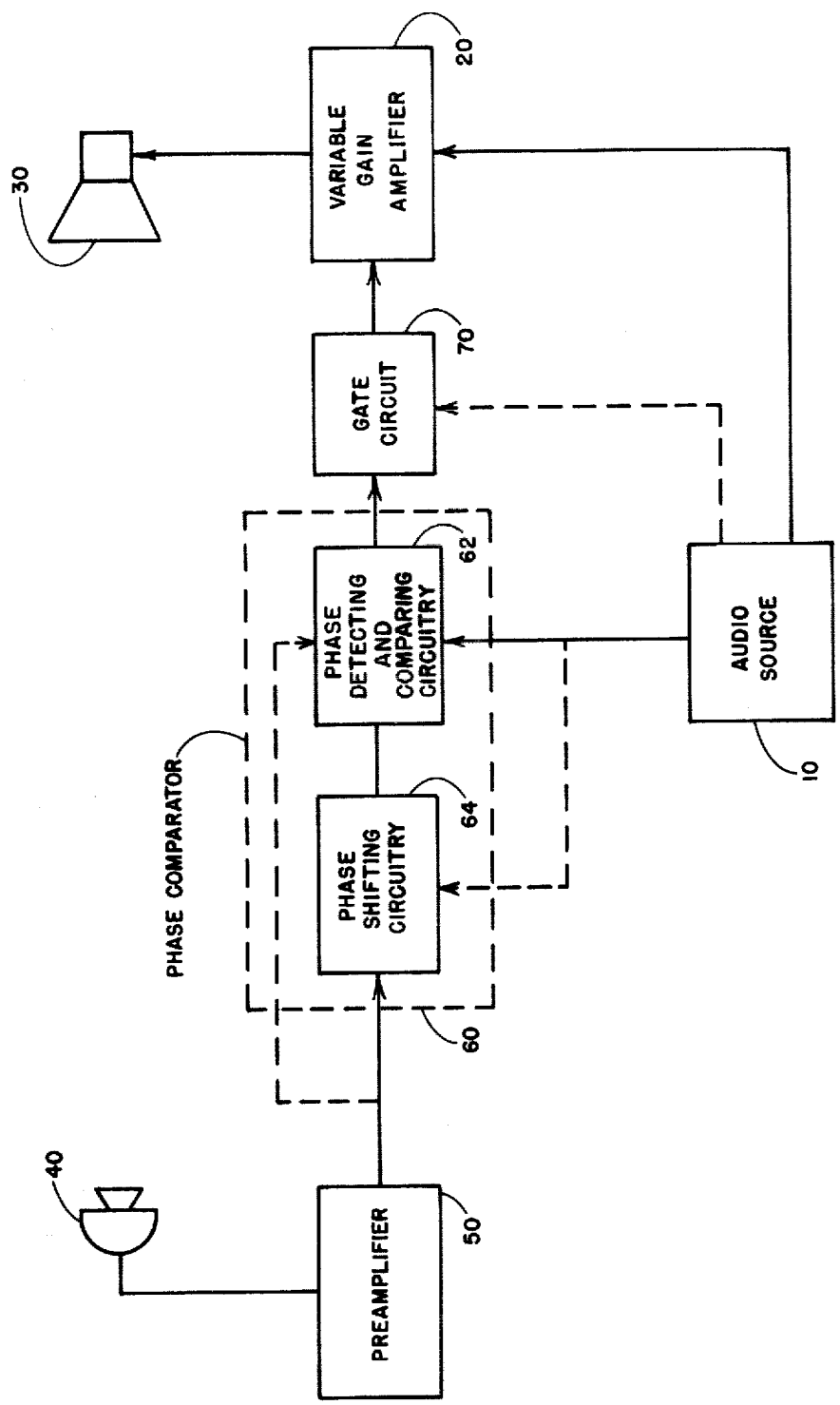

AUTOMATIC VOLUME CONTROL SYSTEM

FIELD OF THE INVENTION

The present invention relates in general to amplifier gain control systems and in particular to noise responsive automatic audio volume control systems.

BACKGROUND OF THE INVENTION

There are numerous situations where it is desired to provide intelligible sound reproduction in environments having highly variable ambient noise levels. Such situations are routinely encountered in the use of public address systems, background music systems, paging systems, and both civilian and military mobile communication systems.

The most straightforward and frequently employed approach to compensating for variable ambient noise is to provide the sound reproduction system with a variable gain or volume control which is responsive to the ambient noise level. In such systems, the volume of the sound reproduction system is varied in dependence on the noise level so as to maintain a signal-to-noise ratio which is sufficiently great to ensure that the data being reproduced by the sound system is discernible or intelligible over the presently existing background noise. Examples of such prior art volume control systems are disclosed in the following U.S. Pat. Nos. 2,338,551 (Stanko); 2,420,933 (Crawford et al); 2,486,480 (Kimball et al); 2,616,971 (Kannenberg); and 3,290,442 (Suganuma). It is to be noted that the foregoing list of patents is not, and is not intended to be, exhaustive of the prior art.

The basic approach employed in each of these systems is simply to obtain a control signal by subtracting a signal corresponding to the desired data signal to be reproduced from a signal corresponding to the reproduced audio data plus the ambient noise present at the time of reproduction. More specifically, the Stanko system compares a portion of the input signal with the filtered output of a microphone which senses both the loudspeaker output and the ambient noise. The microphone output is inverted in polarity so that it opposes the input signal and the data portion of the microphone output is thus cancelled from the compared signal. The compared signal is rectified and the rectified signal used to control a variable gain amplifier.

In the Crawford et al system, the output of a microphone which senses both the loudspeaker output and ambient noise and a compensating voltage corresponding to the program signal are applied to the control grid of the amplifier tube. As the ambient noise level changes, the amplification factor of the amplifier tube changes correspondingly.

In the Kimball et al system, opposing currents representing the aggregate intensity of all sounds detected at a predetermined control point and just the speaker output, respectively, are applied to a resistance network such that the total voltage drop thereacross is proportional to the difference between the two currents. This voltage is used to control electric motors which mechanically actuate volume-control potentiometers.

The Kannenberg system is similar to the Stanko system, in that the gain of a variable gain amplifier is varied in accordance with the difference of two rectified voltages, but the Kannenberg system also contains a limiting circuit.

In the Suganama system, both the program signal and the combined noise and program signal are rectified to eliminate waveform and phase differences between the two signals, and the two rectified signals are combined to actuate driving mechanisms for control potentiometers in a volume control feedback network.

However, such systems suffer from a number of disadvantages. Those systems which utilize filtering, such as the Stanko system, cannot be used in situations, such as those encountered while mobile communication systems, where the noise is random in nature. Those systems which utilize mechanically driven potentiometers, such as the Kimball et al and Suganuma systems, have response times which are too slow for use in other than a relatively stable environment such as an auditorium, and are completely unsuited for use in mobile communication systems and the like. Further, all of the systems have only a limited dynamic range and must provide some form of limiting in order to avoid saturation caused by noise or program induced voltage runaway.

SUMMARY OF THE INVENTION

These and other disadvantages of the prior art are overcome by the automatic volume control system of the present invention, which utilizes phase comparison techniques. In accordance with the present invention, an automatic volume control system comprises a source for producing an audio signal; an amplifier responsive to a control signal for varying the amplitude of the audio signal, a transducer for converting the audio signal to sound energy, a detector for detecting the output of the transducer and ambient noise which interferes with comprehension of the sound energy, and a phase comparator connected to the detector and to the audio signal source for comparing the phases of the outputs thereof and for producing an output proportional to the level of detected ambient noise. The output of the phase comparator is connected as a control signal to the amplifier so as to control the amplitude of the audio signal.

Other features and advantages of the invention will be set forth in, or apparent from, the detailed description of a preferred embodiment found hereinbelow.

BRIEF DESCRIPTION OF THE DRAWING

The FIGURE is a schematic block diagram of a preferred embodiment of the present invention.

DETAILED DESCRIPTION OF THE PREFERRED EMBODIMENT

Referring to the FIGURE, an automatic volume control system constructed in accordance with the present invention generally comprises an audio source 10 for producing an audio signal output; a variable gain amplifier 20 connected to the output of source 10 for amplifying the audio signal produced by source 10 in dependence on a control signal; a transducer 30 connected to the output of amplifier 20 for converting the output of amplifier 20 to sound energy; an audio detector 40 disposed so as to detect the output of transducer 30 as well as ambient noise which interferes with comprehension of the output of transducer 30 by a listener, a preamplifier 50 for amplifying the output of detector 40 to a predetermined level and for providing impedance matching, a phase comparator 60 connected to the output of source 10 and preamplifier 50 for comparing the phases of the output signals thereof and producing an output proportional to the level of ambient noise detected; and a gate circuit 70 connecting the output of phase comparator 60 to the control signal input of variable gain amplifier 20 for controlling when an output from phase comparator 60 varies the gain of amplifier 20.

Audio source 10 advantageously comprises any conventional source of an audio signal, such as a public address system, a paging system, a background music system, or the receiver of a mobile communications system. Additionally, audio source 10 optionally is conventionally configured so as to produce a control signal for controlling gate circuit 70 in dependence on the presence of a predetermined audio signal output from source 10. Amplifier 20 also is conventional, and, as will be appreciated by those of ordinary skill in the art, can advantageously take the form either of a separate modular unit or an integral component of audio source 10. Preferably, amplifier 20 is conventionally configured such that the gain thereof is variable between adjustable predetermined minimum and maximum levels.

Transducer 30 and detector 40 advantageously comprise a conventional loudspeaker or set of loudspeakers and a conventional microphone or set of microphones, respectively. Preamplifier 50 advantageously also is conventional and is selected for efficient coupling of detector 40 to phase comparator 60. As will be appreciated by those of ordinary skill in the art, detector 40 can be matched to phase comparator 60 such that preamplifier 50 is unnecessary.

Phase comparator 60 advantageously comprises conventional phase detecting and comparing circuitry 62. As will be appreciated by those of ordinary skill in the art, when detector 40 detects ambient noise alone, or ambient noise as well as the output of transducer 30, the output of detector 40 will differ in phase from the output produced when only the output of transducer 30 is detected, and the difference in phase will be proportional to the relative volume of the ambient noise vis-a-vis the output of transducer 30. Phase comparator 60 advantageously is thus conventionally configured such that no output signal is produced when the output from detector 40 consists of substantially only the output from transducer 30 and such that an output proportional to the degree of phase difference is produced when the output from detector 40 consists of either ambient noise alone or both ambient noise and the output from transducer 30. As will be appreciated by those of ordinary skill in the art, comparator 60 advantageously includes for this purpose conventional manually adjustable phase shifting circuitry 64 for shifting the phase of the input to comparator 60 from preamplifier 50 or source 10 such that the signals compared by comparator 60 are in phase when the output from detector 40 consists of substantially only the output from transducer 30.

Gate circuit 70 also is advantageously of conventional design to prevent short duration increases in ambient noise from causing unwanted fluctuations in the gain of amplifier 20, and thus in the output amplitude of transducer 30. In addition, when transducer 30 and audio source 10 are audio-coupled in a feedback network, such as exists when audio source 10 comprises a public address system, gate circuit 70 is also conventionally configured so as to be responsive to the presence of a control signal from audio source 10 corresponding to the presence of a desired audio signal output. In the absence of such a control signal, gate circuitry 70 blocks the output of comparator 60 from increasing the output amplitude of transducer 30 in response to the presence of ambient noise alone.

As will be appreciated by those of ordinary skill in the art, the automatic volume control system of the present invention causes the output of transducer 30 to remain at a predetermined minimum amplitude level in the absence of ambient noise, and to increase in amplitude up to a predetermined maximum level in the presence of ambient noise lasting for longer than a predetermined minimum duration and in dependence on the relative volume of the ambient noise.

Although the invention has been described with respect to an exemplary embodiment thereof, it will be understood that variations and modifications can be effected in the embodiment without departing from the scope or spirit of the invention. It will also be appreciated that the configuration of each of the components comprising the present invention is completely conventional and does not form a part of the present invention.

I claim:

1. An automatic volume control system comprising:
   a source for producing an audio signal;
   amplifier means responsive to a control signal for varying the amplitude of said audio signal;
   transducer means coupled to the output of said amplifier means for converting said varied audio signal to sound energy;
   detector means disposed for receiving both sound energy emitted as the output of said transducer means and ambient noise which interferes with comprehension of the output of said transducer means;
   phase comparator means connected to said detector means and connected to said audio signal source, for comparing the phase of the output of said detector with the phase of said audio signal and for producing, responsive to said phase comparison an output proportional to the level of detected ambient noise, the output of said phase comparator means being connected to said amplifier means so as to control said amplifier means and hence the amplitude of said audio signal in accordance with the output of said phase comparator means.

2. The automatic volume control system of claim 1 further comprising gate means connecting the output of said phase comparator means to said amplifier means for preventing ambient noise in the output of said phase comparator means having a shorter duration than a predetermined minimum from varying the amplitude of said audio signal.

3. The automatic volume control system of claim 2 wherein said gate means is responsive to a control signal corresponding to the presence of a predetermined audio signal for preventing ambient noise from varying the amplitude of said audio signal in the absence of said predetermined audio signal.

4. The automatic volume control system of claim 1 wherein said phase comparator means comprises means for shifting the phase of either said audio signal or said detector output such that the signals compared are in phase when said detector output is derived substantially only from said transducer output.

* * * * *